(12) United States Patent
Rangarajan et al.

(10) Patent No.: US 6,486,078 B1
(45) Date of Patent: Nov. 26, 2002

(54) SUPER CRITICAL DRYING OF LOW K MATERIALS

(75) Inventors: Bharath Rangarajan, Santa Clara, CA (US); Ramkumar Subramanian, San Jose, CA (US); Bhanwar Singh, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 39 days.

(21) Appl. No.: 09/643,531

(22) Filed: Aug. 22, 2000

(51) Int. Cl.[7] ............................................... H01L 21/31
(52) U.S. Cl. ........................ 438/778; 438/765; 438/779
(58) Field of Search ................................ 438/778, 765, 438/779, 780, 789, 790, 782

(56) References Cited

U.S. PATENT DOCUMENTS

| | | | |
|---|---|---|---|
| 2,249,767 A | * 7/1941 | Kistler ........................ 252/273 |
| 3,672,833 A | * 6/1972 | Teichner et al. .............. 23/182 |
| 4,713,233 A | * 12/1987 | Marsh et al. ................ 423/608 |
| 5,185,296 A | 2/1993 | Morita et al. ................ 437/229 |
| 5,252,620 A | 10/1993 | Elliott, Jr. et al. .......... 521/149 |
| 5,275,796 A | * 1/1994 | Tillotson et al. ............. 423/338 |
| 5,393,712 A | 2/1995 | Rostoker et al. ............. 437/238 |
| 5,470,802 A | * 11/1995 | Gnade et al. ................ 437/238 |
| 5,509,959 A | 4/1996 | Nielsen et al. .......... 106/287.35 |
| 5,591,676 A | 1/1997 | Hughes et al. .............. 437/195 |
| 5,804,508 A | 9/1998 | Gnade et al. ................ 438/778 |
| 5,855,819 A | 1/1999 | DeSimone et al. .......... 252/511 |
| 5,889,104 A | 3/1999 | Rosemayer ................. 524/545 |
| 5,900,290 A | 5/1999 | Yang et al. .................. 427/577 |
| 5,928,791 A | 7/1999 | Rosemayer ................. 428/421 |
| 5,943,585 A | 8/1999 | May et al. ................... 438/400 |

FOREIGN PATENT DOCUMENTS

EP 0453107 10/1991 ............ C23C/16/00

OTHER PUBLICATIONS

International Report.
Phalippou, J., et al., "Glasses from aerogels," Journal of Materials Science, 25 (1990) Jul., No. 7, p. 3111–3117.

* cited by examiner

Primary Examiner—Matthew Smith
Assistant Examiner—Renzo N. Rocchegiani
(74) Attorney, Agent, or Firm—Amin & Turocy, LLP

(57) ABSTRACT

One aspect of the present invention relates to a method of forming a low k material layer on a semiconductor substrate, involving the steps of depositing a mixture containing a low k material and a casting solvent on the semiconductor substrate; optionally contacting the mixture with a transition solvent whereby the casting solvent is removed from the mixture to form a second mixture containing the low k material and the transition solvent; contacting the second mixture with a supercritical fluid whereby the transition solvent is removed from the second mixture; and permitting the supercritical fluid to evaporate thereby forming the low k material layer.

20 Claims, 1 Drawing Sheet

SUPER CRITICAL DRYING OF LOW K MATERIALS

TECHNICAL FIELD

The present invention generally relates to processing a semiconductor substrate. In particular, the present invention relates to methods of forming a high quality low k material layer on a semiconductor substrate using a supercritical fluid.

BACKGROUND ART

High performance integrated circuit chips contain of millions of transistors that perform various functions including random access memory, central processing communications, and the like. Each of the transistors is interconnected with electrically conducting elements. In order to efficiently accomplish this on a single chip, a typical integrated circuit chip contains multiple layers of conducting elements. Since there are size constraints associated with placing millions of conducting elements on a chip having an area of only a few square centimeters, the connecting elements themselves are very small, and the distance that separates conducting elements is small as well. For example, a state-of-the-art integrated circuit produced today has a conductor width of 0.18 to 0.25 $\mu$m and conductor spacing of 0.18 to 0.25 $\mu$m.

Dielectric materials are widely used in the semiconductor industry to separate structures on an integrated circuit chip, such as separating metal interconnect layers from active devices. Dielectrics are also used to separate two adjacent metal interconnect layers to prevent shorting between the metal layers. With an increasing number of levels in integrated circuit chips, there is growing emphasis on the quality of so-called interlevel dielectrics. This is because multiple levels of metal interconnects are necessary in order to achieve higher packing densities and smaller chip sizes with increased circuit complexity.

The smaller geometries raise certain electrical performance problems that are not of concern in older generation integrated circuits. The reduced spacing results in increased electrical capacitance, which in turn causes capacitative interconnect delay that can slow down the operational speed of the circuit. Increased capacitance increases the amount of power that the integrated circuit requires to operate. Increased capacitance also causes cross-talk that can result in generating signal errors.

Since the dimensions of current integrated circuits are constrained, and since the trend is to continue decreasing geometries, it is necessary to reduce the capacitance in integrated circuit chips. Conventional semiconductor fabrication commonly uses high density or conventional silicon dioxide and/or spin-on glass as a dielectric.

One disadvantage associated with high density silicon dioxide and/or spin-on glass dielectrics is their relatively high permitivity or dielectric constant. Typically, high density silicon dioxide and/or spin-on glass have a relative (to permitivity of free space) dielectric constant of 3.9 or higher. High dielectric constant materials produce capacitive loads on the adjacent conductors which degrades performance of both high frequency and high density transistors.

Another disadvantage associated with high density silicon dioxide and/or spin-on glass dielectrics is that thicker dielectric layers are required to compensate for the high dielectric constant. Thicker layers result in larger geometry devices, increasing the overall size and cost of the integrated circuit chip while reducing functionality. Additionally, thick dielectric layers increase planarization problems, making it difficult to form multi-layer metallizations on top of the dielectrics.

An important factor for judging the quality of a dielectric is dielectric strength. Dielectric strength is typically referred to as breakdown voltage or breakdown field strength. Breakdown field strength is a property with units of volts per unit length at which an insulative material does not insulate, breaks down and results in a short circuit. Calculating the required minimum breakdown field strength for an integrated circuit involves taking the operating voltage of the circuit and dividing it by the separation distance between adjacent conducting elements. For example, in a 0.25 $\mu$m technology integrated circuit that operates at a voltage of 3.3 volts, the minimum breakdown field strength required is 3.3 volts divided by 0.25 microns, which equals 13.2 V/$\mu$m, or 0.132 MV/cm. Typical safety margins are several times this or a minimum of about 0.5 MV/cm. The breakdown field strength of air is less than 1 volt per micron. Another factor for judging the quality of a dielectric is leakage current. Leakage current is low level current flux through an insulator of field strength less than the breakdown field strength. A typical requirement for an integrated circuit is a leakage current density less than $2 \times 10^{-8}$ amps/cm$^2$ and an applied electric field strength of 0.05 MV/cm.

Generally speaking, therefore, it is desirable to provide a dielectric material layer with a high breakdown field strength and low leakage current. Low k material layers are attractive in this respect because they possess both high breakdown field strength and low leakage current. However, there are problems associated with forming low k material layers. For instance, heat causes deleterious structural damage to a low k material layer or film (structural collapse of the low k material). Temperatures as low as 350° C. can cause such damage in certain low k material layers. This is a problem because semiconductor processing often involves high temperature steps. Consequently, various layers used in fabricating semiconductor devices must be able to withstand high temperatures.

Another problem associated with low k material layers involves solvent removal after application. Incomplete solvent removal leads to undesirable increases in the dielectric constant of the subsequently formed low k material layer. Increases in the dielectric constant consequently degrade the electrical properties and thus the reliability of the electronic devices made with such low k materials. Incomplete solvent removal also provides a failure mechanism for a device formed with the low k material layer, since the unremoved solvent may vaporize out of the layer and damage another layer or structure within the device. Incomplete solvent removal is therefore a significant concern.

Yet another problem associated with low k material layers involves solvent removal by evaporation from low k material layers, in that evaporation creates high surface tension forces that sometimes induces deleterious structural collapse of the low k material layer.

SUMMARY OF THE INVENTION

The present invention provides methods for making semiconductor structures with low k insulation materials using a supercritical fluid. The present invention also provides methods for forming high quality low k material layers in semiconductor structures by minimizing and/or eliminating residual solvents in the low k material layers. The high quality low k material layers leads to the formation of electronic devices having desirable electrical properties. The low k material layers made in accordance with the present invention have at least one of high temperature stability, the absence of residual solvent, a desirable structural network, high breakdown field strength and low leakage current.

One aspect of the present invention relates to a method of forming a low k material layer on a semiconductor substrate, involving the steps of depositing a mixture containing a low k material and a casting solvent on the semiconductor substrate; optionally contacting the mixture with a transition solvent whereby the casting solvent is removed from the mixture to form a second mixture containing the low k material and the transition solvent; contacting the mixture or second mixture with a supercritical fluid whereby the casting solvent or the transition solvent is removed from the mixture or the second mixture; and permitting the supercritical fluid to evaporate thereby forming the low k material layer.

Another aspect the present invention relates to a method processing a low k material, involving the steps of depositing a mixture comprising the low k material and a casting solvent on a semiconductor substrate wherein the casting solvent comprises at least one of deionized water, a water based dispersion, a water-in-oil emulsion, an oil-in-water emulsion, benzenes, chlorobenzenes, anisole, cyclohexanone, a lower alkyl alcohol, a lower alkyl ketone, and a lower alkyl ester, wherein each alkyl group has 5 or less carbon atoms; contacting the mixture with a transition solvent whereby the casting solvent is removed from the mixture to form a second mixture comprising the low k material and the transition solvent, wherein the transition solvent comprises at least one of a lower alkyl alcohol, a lower alkyl ketone, and a lower alkyl ester, wherein each alkyl group has 5 or less carbon atoms; contacting the second mixture with a supercritical fluid whereby the transition solvent is removed from the second mixture; and permitting the supercritical fluid to evaporate thereby forming a low k material layer having a dielectric constant below about 3.8.

Yet another aspect of the present invention relates to a method of making a low k dieletric layer, involving the steps of depositing a mixture comprising a low k material and a casting solvent on a semiconductor substrate; contacting the mixture with an organic solvent whereby the casting solvent is removed from the mixture to form a second mixture comprising the low k material and the organic solvent, wherein the organic solvent comprises at least one of a ketone, an ester, an alcohol, an ether, and an aromatic hydrocarbon; contacting the second mixture with a supercritical fluid using spin coating whereby the organic solvent is removed from the second mixture, wherein the supercritical fluid comprises at least one of $CO_2$, $N_2O$, $C_2H_6$, $CFH_3$, $H_2O$, $NH_3$, and $CClF_3$; and permitting the supercritical fluid to evaporate thereby forming the low k dieletric layer having a dielectric constant below about 3.

DISCLOSURE OF INVENTION

Figure 1:
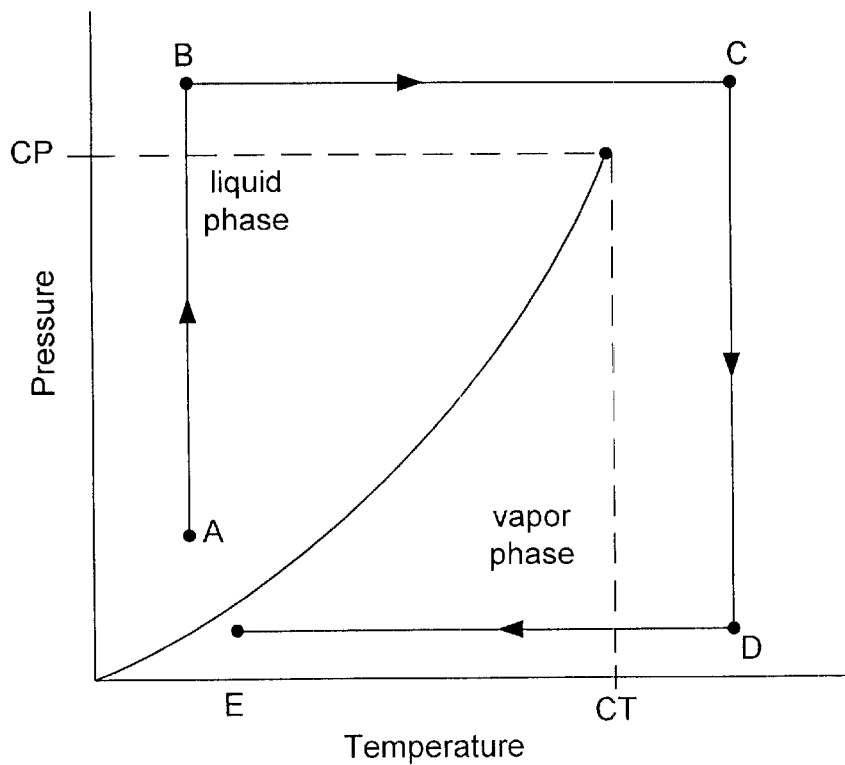
FIG. 1 shows a method of forming a supercritical fluid in the context of a phase diagram according to one aspect of the present invention.

The present invention involves forming high quality, well defined low k material layers in semiconductor devices using a supercritical fluid. Generally speaking, this is accomplished by depositing a low k material in a casting solvent onto a wafer, optionally contacting a transition solvent with the wafer, and then contacting a supercritical fluid with the wafer.

Low k materials are insulation materials; that is, a material with a low dielectric constant. Low k materials provide electrical insulation between various layers, devices, structures, and regions within semiconductor substrates. For purposes of this invention, low k materials have a dielectric constant below about 3.8. In another embodiment, low k materials have a dielectric constant below about 3. In yet another embodiment, low k materials have a dielectric constant below about 2.5. In still yet another embodiment, low k materials have a dielectric constant below about 2.0.

General examples of low k materials include low k polymers, low k fluorine containing compounds, and low k fluoropolymers. Examples of low k materials include polyimides, fluorinated polyimides, polysilsequioxane, benzocyclobutene (BCB), fluorinated benzocyclobutene, fluorosilicate glass, silicon oxyfluoride, fluorinated polysilicon, polyphenylquinoxaline, copolymers of 2,2-bistrifluoromethyl-4,5-difluoro-1,3-dioxole, perfluoroalkoxy resin, fluorinated ethylene propylene, fluoromethacrylate, poly(arylene ether), parylene F, parylene N, amorphous polytetrafluoroethylene, and low density glass such as low density silicon dioxide. Low density silicon dioxide may be made using sol-gel techniques.

Specific examples of a commercially available low k materials include those under the trade designations Flare™ from AlliedSignal, believed to be derived from perfluorobiphenyl and aromatic bisphenols; Black Diamond™ from Applied Materials; ALCAP-S from Asahi Chemical; SiLK® and Cyclotene® BCB from Dow Chemical; Teflon® polytetrafluoroethylene from DuPont; XLK and 3MS from Dow Corning; HSG RZ25 from Hitachi Chemical; HOSP™ and Nanoglass™ from Honeywell Electronic Materials; LKD from JSR Microelectronics; CORAL™ and AF4 from Novellus; mesoporous silica from Battelle PNNL; and Velox™ PAE-2 from Schumacher.

The low k material is provided over a semiconductor substrate in a casting solvent. The semiconductor substrate is typically a silicon substrate optionally with various elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc. The substrate may be static or spinning, and the low k materials in the casting solvent are applied by any suitable technique including spin-on techniques. If the low k material/casting solvent is provided over a static substrate, the substrate may be spun to remove excess solvent.

The casting solvent provides a vehicle to apply the low k material to a substrate surface. Casting solvents, as the term is used herein, are those solvents commonly employed to apply low k materials to semiconductor substrate surfaces. Examples of casting solvents include deionized water, suitable organic solvents, organic monomer mixtures, water based dispersions, water-in-oil emulsions, and oil-in-water emulsions (oil meaning organic solvent). Suitable organic solvents are organic compounds that do not dissolve out low k materials, such as benzenes, halobenzenes including chlorobenzenes, anisole, cyclohexanone, lower alkyl alcohols, lower alkyl ketones, and lower alkyl esters and the like. Examples of lower alkyl alcohol, lower alkyl ketone, and lower alkyl ester casting solvents are provided below in the discussion of transition solvents and thus are not repeated here. The casting solvent may alternatively or additionally include a water-soluble monomer. Water soluble monomers generally comprise at least one of acrylamide, methacrylamide, acrylic acid, methacrylic acid, an acrylic acid salt, vinyl pyrolidone, and vinyl acetate.

In embodiments where the casting solvent is compatible with the low k material and the subsequently employed supercritical fluid, it is not necessary to employ a transition solvent. The casting solvent is compatible with the subsequently employed supercritical fluid if the two substances are miscible. In embodiments where the casting solvent is not compatible with at least one of the low k material and the subsequently employed supercritical fluid, it is necessary to employ a transition solvent. It is in this connection that, after the low k material in a casting solvent is provided over a semiconductor substrate, a transition solvent is optionally applied to the substrate by any suitable technique.

The transition solvent is compatible with the low k material and the subsequently employed supercritical fluid. The transition solvent is compatible with the subsequently employed supercritical fluid if the two substances are miscible. The transition solvent displaces the casting solvent, as the casting solvent is removed from the low k material mixture. The casting solvent is removed in that it is at least substantially removed (although a small amount may remain) and preferably completely removed. In a preferred embodiment, the transition solvent is at a temperature within about 10° C. (higher or lower) of the temperature of the casting solvent. The transition solvent may be deposited on a static or spinning substrate containing the low k material. Typically, the transition solvent is deposited on a static substrate, optionally followed by agitation or spinning.

Transition solvents are typically organic solvents, but inorganic fluids such as water including deionized water may be employed. Preferred transition solvents are lower alkyl alcohols, lower alkyl ketones, and lower alkyl esters. Lower alkyl, for purposes of this invention, means alkyl groups having 5 or less carbon atoms (it is understood that certain compounds, such as ketones and esters, have two or more alkyl groups; and the 5 or less carbon atoms applies to each group). In this connection, methyl amyl ketone is a lower alkyl ketone.

Suitable transition solvents are inorganic or organic solvents including water, ketones such as acetone, methyl ethyl ketone, methyl isobutyl ketone, mesityl oxide, methyl amyl ketone, cyclohexanone and other aliphatic ketones; esters such as methyl acetate, ethyl acetate, iso-amyl acetate, alkyl carboxylic esters; ethers such as methyl t-butyl ether, dibutyl ether, methyl phenyl ether and other aliphatic or alkyl aromatic ethers; glycol ethers such as ethoxy ethanol, butoxy ethanol, ethoxy-2-propanol, propoxy ethanol, butoxy propanol and other glycol ethers; glycol ether esters such as butoxy ethoxy acetate, ethyl 3-ethoxy propionate and other glycol ether esters; alcohols such as methanol, ethanol, propanol, iso-propanol, butanol, iso-butanol, amyl alcohol and other aliphatic alcohols; aromatic hydrocarbons such as benzene, toluene, xylene, and other aromatics or mixtures of aromatic solvents, naphthalene and mineral spirits, and nitro alkanes such as 2-nitropropane. Mixtures of two or more transition solvents may be employed. Preferred transition solvents include ethanol, acetone, methyl ethyl ketone, methyl isobutyl ketone, amyl alcohol, iso-amyl alcohol, amyl acetate, and iso-amyl acetate.

In some embodiments where a transition solvent is employed, the casting solvent and the transition solvent are different compounds (or mixtures of compounds). In other embodiments where a transition solvent is employed, the casting solvent and the transition solvent are the same compounds (or same mixtures of compounds). In these embodiments, it is sometimes desirable to provide clean or fresh solvent to displace contaminated or debris containing casting solvent.

After the casting solvent or the transition solvent is contacted with the low k material covered substrate surface, a supercritical fluid is applied to the substrate. The supercritical fluid displaces the casting solvent or the transition solvent, as the casting solvent and/or the transition solvent is substantially removed from the low k material mixture. A supercritical fluid is a fluid medium that is at a temperature that is sufficiently high that it cannot be liquified by pressure. A supercritical fluid relates to dense gas solutions with enhanced solvation powers, and can include near supercritical fluids. The basis for a supercritical fluid is that at a critical temperature and pressure, the liquid and gas phases of a single substance can co-exist.

The supercritical fluid phenomenon is documented, see pages F-62 to F-64 of the CRC Handbook of Chemistry and Physics, 67th Edition, 1986–1987, published by the CRC Press, Inc., Boca Raton, Fla. At high pressures above the critical point, the resulting supercritical fluid, or "dense gas", attains densities approaching those of a liquid and assumes some of the properties of a liquid. These properties are dependent upon the fluid composition, temperature, and pressure. As used herein, the "critical point" is the transition point at which the liquid and gaseous states of a substance merge with each other and represents the combination of the critical temperature and critical pressure for a given substance.

The compressibility of supercritical fluids is great just above the critical temperature where small changes in pressure result in large changes in the density of the supercritical fluid. The "liquid-like" behavior of a supercritical fluid at higher pressures results in greatly enhanced solubilizing capabilities compared to those of the "subcritical" compound, with higher diffusion coefficients and an extended useful temperature range compared to liquids. An interesting phenomenon associated with supercritical fluids is that as the pressure increases, the solubility of the solute often increases by many orders of magnitude with only a small pressure increase.

Near-supercritical liquids also demonstrate solubility characteristics and other pertinent properties similar to those of supercritical fluids. Fluid "modifiers" can often alter supercritical fluid properties significantly, even in relatively low concentrations. In one embodiment, a fluid modifier is added to the supercritical fluid. These variations are considered to be within the concept of a supercritical fluid as used in the context of this invention. Therefore, as used herein, the phrase "supercritical fluid" also denotes a compound above, at, or slightly below the critical temperature and pressure (the critical point) of that compound.

Examples of compounds which are known to have utility as supercritical fluids are given in Table 1.

TABLE 1

EXAMPLES OF SUPERCRITICAL FLUIDS

| Compound | Boiling Point (° C.) | Critical Temperature (° C.) | Critical Pressure (atm) | Critical Density (g/cm.sup.3) |
|---|---|---|---|---|
| $CO_2$ | 78.5 | 31.3 | 72.9 | 0.448 |
| $NH_3$ | −33.35 | 132.4 | 112.5 | 0.235 |
| $H_2O$ | 100.00 | 374.15 | 218.3 | 0.315 |
| $N_2O$ | −88.56 | 36.5 | 71.7 | 0.45 |
| Xenon | −108.3 | 16.6 | 57.6 | 0.118 |
| Krypton | −153.2 | −63.8 | 54.3 | 0.091 |
| Methane | −164.00 | −82.1 | 45.8 | 0.2 |
| Ethane | −88.63 | 32.28 | 48.1 | 0.203 |
| Ethylene | −103.7 | 9.21 | 49.7 | 0.218 |
| Propane | −42.1 | 96.67 | 41.9 | 0.217 |
| Pentane | 36.1 | 196.6 | 33.3 | 0.232 |
| Methanol | 64.7 | 240.5 | 78.9 | 0.272 |
| Ethanol | 78.5 | 243.0 | 63.0 | 0.276 |
| Isopropanol | 82.5 | 235.3 | 47.0 | 0.273 |
| Isobutanol | 108.0 | 275.0 | 42.4 | 0.272 |
| $CClF_3$ | −31.2 | 28.0 | 38.7 | 0.579 |
| $CFH_3$ | −78.4 | 44.6 | 58.0 | 0.3 |
| Cyclohexanol | 155.65 | 356.0 | 38.0 | 0.273 |

Due to the low cost, environmental acceptability, non-flammability, and low critical temperature of carbon dioxide, nitrous oxide, and water, supercritical carbon dioxide, nitrous oxide and/or $H_2O$ fluid is preferably employed in the present invention.

The supercritical fluid is applied to the substrate containing the low k material and the casting solvent or the transition solvent in any suitable manner. For example, the wafer containing the low k material and the casting solvent or the transition solvent is present in a high pressure chamber. The chamber is flooded with the compound that forms the supercritical fluid (such as carbon dioxide) in liquid form. The pressure is then increased above the critical pressure, followed by raising the temperature above the critical temperature, thereby converting the compound that forms the supercritical fluid into a supercritical fluid. Next, the pressure is decreased to ambient pressure and the temperature is lowered to room temperature.

This method of contacting the wafer containing the low k material and the casting solvent or the transition solvent with the supercritical fluid is graphically illustrated in FIG. 1. Referring to FIG. 1, a phase diagram is shown with the pressure on the y-axis and the temperature on the x-axis. The critical temperature is represented by CT and the critical pressure is represented by CP. The line originating at the origin is the liquid-vapor interface. Point A refers to flooding the chamber with the compound that forms the supercritical fluid in liquid form. Increasing the pressure above the critical pressure is shown by the line from point A to point B; raising the temperature above the critical temperature is shown by the line from point B to point C; decreasing the pressure to ambient pressure is shown by the line from point C to point D; and decreasing the temperature to room temperature is shown by the line from point D to point E. Alternatively, any number of steps (a discrete pressure and temperature increase or decrease) may be employed, so long as the liquid-vapor interface line is not crossed.

Since the liquid-vapor interface line is not crossed when forming the supercritical fluid, interfacial tension forces associated with the liquid-vapor interface are avoided. Such interfacial tension forces may, in some instances, collapse the three dimensional network of the low k material.

Alternatively, after the wafer containing the low k material and the casting solvent or the transition solvent is provided in the high pressure chamber and the chamber is flooded with the compound that forms the supercritical fluid in liquid form, the pressure and temperature are raised simultaneously to the critical temperature and pressure ensuring that the liquid phase of the compound that forms the supercritical fluid remains in liquid form.

Figure 2:
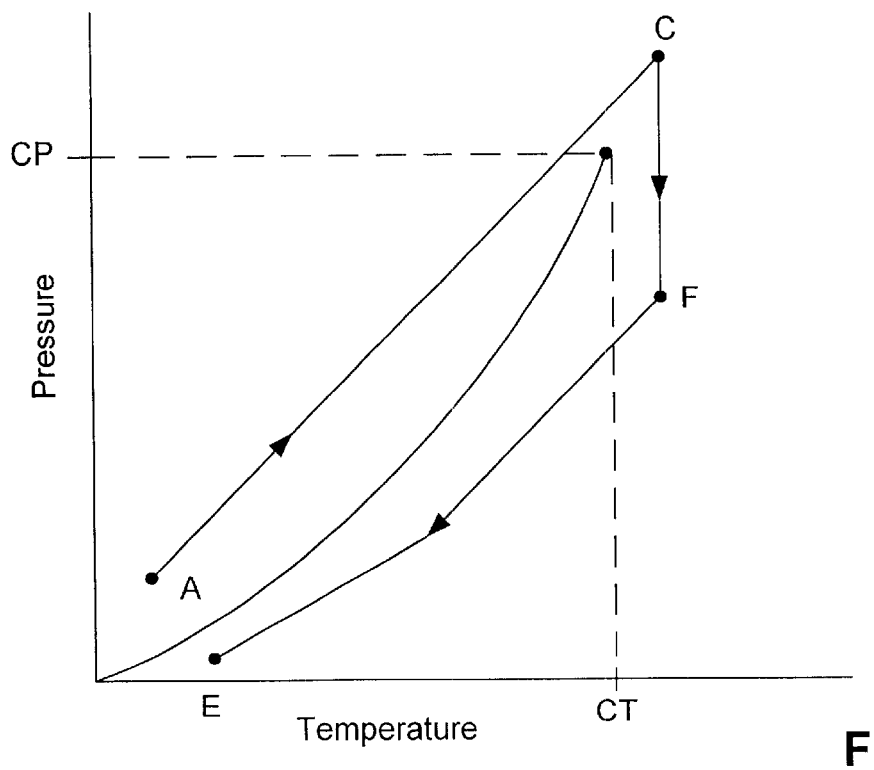
FIG. 2 shows another method of forming a supercritical fluid in the context of a phase diagram according to another aspect of the present invention.

This method of contacting the wafer containing the low k material and the casting solvent or the transition solvent with the supercritical fluid is graphically illustrated in FIG. 2. Referring to FIG. 2, a phase diagram is shown with the pressure on the y-axis and the temperature on the x-axis, wherein the critical temperature is represented by CT and the critical pressure is represented by CP, and the line originating at the origin is the liquid-vapor interface. Point A refers to flooding the chamber with the compound that forms the supercritical fluid in liquid form. Simultaneously increasing the pressure and temperature above the critical pressure is shown by the line from point A to point C; decreasing the pressure is shown by the line from point C to point F; and simultaneously decreasing the temperature to room temperature and ambient pressure is shown by the line from point F to point E. Again, since the liquid-vapor interface line is not crossed when forming the supercritical fluid, interfacial tension forces associated with the liquid-vapor interface are avoided.

The supercritical fluid, after replacing the casting solvent or the transition solvent, "evaporates", out-gases or otherwise is removed from the low k material without causing any structural damage to the three dimensional network of the low k material. The supercritical fluid is removed completely or at least substantially completely. While not wishing to be bound by any theory, it is believed that this is because detrimental surface tension forces, which can damage the microstructure of the three dimensional network of the low k material, are avoided since there is no liquid-air interface associated with a supercritical fluid. Moreover, since the supercritical fluid is easily and completely removed from the low k material, residual solvent concerns are minimized and/or eliminated (or alternatively, there are inconsequentially small residual amounts). Since residual solvent concerns are minimized, problems such as increases in the dielectric constant of the subsequently formed low k material layer and solvent outgassing induced damage to other layers within the device are minimized and/or eliminated.

The microstructure of the three dimensional network of the low k material formed in accordance with the present invention is characterized by numerous pores or air pockets (in other words, "spongy"). The air pockets provide insulation characteristics to the low k material layer, as air has a dielectric constant of 1.

Optionally, after the supercritical fluid is contacted with the low k material covered substrate surface, the substrate may be heated or baked for a short period of time to ensure that the supercritical fluid is completely removed from the low k material.

The thickness of the low k material layer formed in accordance with the present invention is not critical to the invention. In one embodiment, however, the thickness of the resulting low k material layer is from about 200 Å to about 20,000 Å. In another embodiment, the thickness of the resulting low k material layer is from about 500 Å to about 10,000 Å. In yet another embodiment, the thickness of the resulting low k material layer is from about 1,000 Å to about 5,000 Å.

Low k material layers formed in accordance with the present invention have a lower dielectric constant and/or a higher breakdown voltage than low k material layers formed in conventional manners (in instances where the comparison involves the same low k material). In one embodiment, the low k material layers formed in accordance with the present invention have at least about a 5% lower dielectric constant and/or at least about a 5% higher breakdown voltage than low k material layers formed in conventional manners. In another embodiment, the low k material layers formed in accordance with the present invention have at least about a 10% lower dielectric constant and/or at least about a 10% higher breakdown voltage than low k material layers formed in conventional manners.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a low k fluoropolymer layer on a semiconductor substrate, comprising:

depositing a mixture comprising a low k fluoropolymer and a casting solvent on the semiconductor substrate, wherein the low k fluoropolymer comprises at least one of a fluorinated polyimide, a fluorinated benzocyclobutene, a copolymer of 2,2-bistrifluoromethyl 4,5-difluoro-1,3-dioxole, a perfluoroalkoxy resin, fluorinated ethylene propylene, fluoromethacrylate, parylene F, and amorphous polytetrafluoroethylene;

optionally contacting the mixture with a transition solvent whereby the casting solvent is removed from the mixture to form a second mixture comprising the low k fluoropolymer and the transition solvent, wherein the transition solvent comprises at least one of a lower alkyl alcohol, a lower alkyl ketone, and a lower alkyl ester, wherein each alkyl group has 5 or less carbon atoms;

contacting the mixture or the second mixture with a supercritical fluid whereby the casting solvent or the transition solvent is removed from the mixture or the second mixture; and permitting the supercritical fluid to evaporate thereby forming the low k fluoropolymer layer having a dielectric constant below about 3.

2. The method of claim 1, wherein the casting solvent comprises at least one of deionized water, a water based dispersion, a water-in-oil emulsion, an oil-in-water emulsion, benzenes, chlorobenzenes, anisole, cyclohexanone, acetone, methyl ethyl ketone, methyl isobutyl ketone, mesityl oxide, methyl amyl ketone, cyclohexanone, methyl acetate, ethyl acetate, iso-amyl acetate, alkyl carboxylic esters, methyl t-butyl ether, dibutyl ether, methyl phenyl ether, ethoxy ethanol, butoxy ethanol, ethoxy-2-propanol, propoxy ethanol, butoxy propanol, butoxy ethoxy acetate, ethyl 3-ethoxy propionate, methanol, ethanol, propanol, iso-propanol, butanol, iso-butanol, amyl alcohol, benzene, toluene, xylene, naphthalene, mineral spirits, and 2-nitropropane.

3. The method of claim 1, wherein the low k fluoropolymer layer has a dielectric constant below about 2.5.

4. The method of claim 1, wherein the supercritical fluid comprises at least one of $CO_2$, $N_2O$, $H_2O$, $C_2H_6$, $CFH_3$, $CClF_3$, $NH_3$, xenon, krypton, methane, ethylene, propane, pentane, methanol, ethanol, isopropanol, isobutanol, and cyclohexanol.

5. The method of claim 1, wherein the low k fluoropolymer comprises at least one of a fluorinated polyimide, a fluorinated benzocyclobutene, fluoromethacrylate, and amorphous polytetrafluoroethylene.

6. The method of claim 1, wherein the supercritical fluid has a critical temperature and pressure and is formed by providing a composition in a liquid phase, raising the pressure of the composition above the critical pressure, and raising the temperature above the critical temperature.

7. The method of claim 1, further comprising, after depositing the mixture comprising the low k fluoropolymer and the casting solvent on the semiconductor substrate, contacting the mixture with a transition solvent whereby the casting solvent is removed from the mixture to form a second mixture comprising the low k material and the transition solvent; then contacting the second mixture with the supercritical fluid whereby the transition solvent is removed from the second mixture; and permitting the supercritical fluid to evaporate thereby forming the low k fluoropolymer layer.

8. The method of claim 7, wherein the transition solvent comprises at least one of acetone, methyl ethyl ketone, methyl isobutyl ketone, mesityl oxide, methyl amyl ketone, cyclohexanone, methyl acetate, ethyl acetate, iso-amyl acetate, alkyl carboxylic esters, methyl t-butyl ether, dibutyl ether, methyl phenyl ether, ethoxy ethanol, butoxy ethanol, ethoxy-2-propanol, propoxy ethanol, butoxy propanol, butoxy ethoxy acetate, ethyl 3-ethoxy propionate, methanol, ethanol, propanol, iso-propanol, butanol, iso-butanol, amyl alcohol, benzene, toluene, xylene, naphthalene, mineral spirits, and 2-nitropropane.

9. A method processing a low k fluoropolymer, comprising:

depositing a mixture comprising the low k fluoropolymer and a casting solvent on a semiconductor substrate wherein the casting solvent comprises at least one of deionized water, a water based dispersion, a water-in-oil emulsion, an oil-in-water emulsion, benzenes, chlorobenzenes, anisole, cyclohexanone, a lower alkyl alcohol, a lower alkyl ketone, and a lower alkyl ester, wherein each alkyl group has 5 or less carbon atoms, and the low k fluoropolymer comprises at least one of a fluorinated polyimide, a fluorinated benzocyclobutene, a copolymer of 2,2-bistrifluoromethyl-4,5-difluoro-1,3-dioxole, a perfluoroalkoxy resin, fluorinated ethylene propylene, fluoromethacrylate, parylene F, and amorphous polytetrafluoroethylene;

contacting the mixture with a transition solvent whereby the casting solvent is removed from the mixture to form a second mixture comprising the low k fluoropolymer and the transition solvent, wherein the transition solvent comprises at least one of a lower alkyl alcohol, a lower alkyl ketone, and a lower alkyl ester, wherein each alkyl group has 5 or less carbon atoms;

contacting the second mixture with a supercritical fluid whereby the transition solvent is removed from the second mixture; and permitting the supercritical fluid to evaporate thereby forming a low k fluoropolymer layer having a dielectric constant below about 3.

10. The method of claim 9, wherein the low k fluoropolymer comprises at least one of a fluorinated benzocyclobutene, a copolymer of 2,2-bistrifluoromethyl-4,5-difluoro-1,3-dioxole, and amorphous polytetrafluoroethylene.

11. The method of claim 9, wherein the casting solvent comprises at least one of deionized water, chlorobenzene, anisole, cyclohexanone, acetone, methyl ethyl ketone, methyl isobutyl ketone, mesityl oxide, methyl amyl ketone, cyclohexanone, methyl acetate, ethyl acetate, iso-amyl acetate, alkyl carboxylic esters, methyl t-butyl ether, dibutyl ether, methyl phenyl ether, ethoxy ethanol, butoxy ethanol, ethoxy-2-propanol, propoxy ethanol, butoxy propanol, butoxy ethoxy acetate, ethyl 3-ethoxy propionate, methanol, ethanol, propanol, iso-propanol, butanol, iso-butanol, amyl alcohol, benzene, toluene, xylene, naphthalene, mineral spirits, and 2-nitropropane.

12. The method of claim 9, wherein the supercritical fluid comprises at least one of $CO_2$, $N_2O$, $C_2H_6$, $CFH_3$, $H_2O$, $NH_3$, and $CClF_3$.

13. The method of claim 9, wherein the transition solvent is at a temperature within about 10° C. of the casting solvent.

14. The method of claim 9, wherein the low k fluoropolymer layer has a dielectric constant below about 2.

15. The method of claim 9, wherein the supercritical fluid has a critical temperature and pressure and is formed by providing a composition in a liquid phase, and simultaneously raising the pressure of the composition above the critical pressure and the temperature above the critical temperature.

16. A method of making a low k fluoropolymer dieletric layer, comprising:

depositing a mixture comprising a low k fluoropolymer and a casting solvent on a semiconductor substrate, wherein the low k fluoropolymer comprises at least one of a fluorinated polyimide, a fluorinated benzocyclobutene, a copolymer of 2,2-bistrifluoromethyl-4,5-difluoro-1,3-dioxole, a perfluoroalkoxy resin, fluorinated ethylene propylene, fluoromethacrylate, parylene F, and amorphous polytetrafluoroethylene;

contacting the mixture with an organic solvent whereby the casting solvent is removed from the mixture to form a second mixture comprising the low k fluoropolymer and the organic solvent, wherein the organic solvent comprises at least one of a ketone, an ester, an alcohol, an ether, and an aromatic hydrocarbon;

contacting the second mixture with a supercritical fluid using spin coating whereby the organic solvent is removed from the second mixture, wherein the supercritical fluid comprises at least one of $CO_2$, $N_2O$, $C_2H_6$, $CFH_3$, $H_2O$, $NH_3$, and $CClF_3$ wherein the supercritical fluid has a critical temperature and pressure and is formed by providing a composition in a liquid phase; and permitting the supercritical fluid to evaporate by raising the pressure of the composition above the critical pressure, and raising the temperature above the critical temperature thereby forming the low k fluoropolymer dieletric layer having a dielectric constant below about 3.

17. The method of claim 16, wherein the low k fluoropolymer comprises at least one of a fluorinated benzocyclobutene, a perfluoroalkoxy resin, fluorinated ethylene propylene, fluoromethacrylate, and amorphous polytetrafluoroethylene.

18. The method of claim 16, wherein the casting solvent comprises at least one of deionized water, an organic monomer mixture, a water based dispersion, a water-in-oil emulsion, an oil-in-water emulsion, chlorobenzene, anisole, cyclohexanone, acetone, methyl ethyl ketone, methyl isobutyl ketone, mesityl oxide, methyl amyl ketone, cyclohexanone, methyl acetate, ethyl acetate, iso-amyl acetate, alkyl carboxylic esters, methyl t-butyl ether, dibutyl ether, methyl phenyl ether, ethoxy ethanol, butoxy ethanol, ethoxy-2-propanol, propoxy ethanol, butoxy propanol, butoxy ethoxy acetate, ethyl 3-ethoxy propionate, methanol, ethanol, propanol, iso-propanol, butanol, iso-butanol, amyl alcohol, benzene, toluene, xylene, naphthalene, mineral spirits, and 2-nitropropane.

19. The method of claim 16, wherein the supercritical fluid comprises at least one of $CO_2$ and $N_2O$.

20. The method of claim 16, wherein the low k fluoropolymer dieletric layer has a thickness from about 200 Å to about 20,000 Å.

* * * * *